United States Patent
Madni et al.

(10) Patent No.: US 6,545,621 B1
(45) Date of Patent: Apr. 8, 2003

(54) DIGITALLY PROGRAMMABLE PULSE-WIDTH MODULATION (PWM) CONVERTER

(75) Inventors: Asad M. Madni, Los Angeles, CA (US); Jim B. Vuong, Northridge, CA (US); Philip Vuong, Northridge, CA (US)

(73) Assignee: BEI Sensors & Systems Company, Inc.,, Sylmar, CA (US)

( * ) Notice: Subject to any disclaimer, the term of this patent is extended or adjusted under 35 U.S.C. 154(b) by 0 days.

(21) Appl. No.: 10/006,092

(22) Filed: Dec. 6, 2001

(51) Int. Cl.[7] .............................................. H03M 1/60
(52) U.S. Cl. ...................................... 341/143; 341/155
(58) Field of Search ................................. 341/143, 155, 341/157, 120, 158

(56) References Cited

U.S. PATENT DOCUMENTS 5,613,149 A  *  3/1997  Afek ........................... 341/155

* cited by examiner

Primary Examiner—Brian Young
(74) Attorney, Agent, or Firm—Coudert Brothers LLP

(57) ABSTRACT

A digitally programmable pulse-width-modulation (PWM) converter changes a 0% to 100% duty cycle input signal to any desired start and stop duty cycle range; for example, 5% to 95%. This is achieved by the difference in start and stop duty cycles forming a ratio which determines a pair of clock frequencies for modifying the PWM signal to provide the new start and stop duty cycle parameters.

5 Claims, 2 Drawing Sheets

DIGITALLY PROGRAMMABLE PULSE-WIDTH MODULATION (PWM) CONVERTER

The present application is directed to a Digitally Programmable Pulse-Width Modulation (PWM) Converter and more specifically a converter for modifying the start and stop duty cycles of the PWM signal.

BACKGROUND OF THE INVENTION

In the automotive field, position and torque sensors are now being introduced. One specific application is for the steering of an automobile. Such sensors provide their outputs in two basic forms, i.e., analog and digital. Among the formats for digital outputs are a) serial and parallel data derived from Analog-to-Digital Converters (ADC's), b) pulse frequency representing the analog sensor output, derived from Voltage-to-Frequency Converters (VFC), and c) a Pulse Width Modulated (PWM) output where the duty cycle of the pulse represents the sensor output.

Several PWM circuits have been developed that provide 0% to 100% duty cycles to represent the full scale output of the sensor. However, specialized applications require the start and stop duty cycles to be very specific, e.g., 5% and 95% to represent the total sensor full scale output.

When the foregoing PWM signal is being used as a control signal in a feedback control circuit (for example, for controlling steering), reliability is very important. For example, from a digital standpoint it is hard to identify a 0% PWM signal. This is especially true where angular rotation of a steering is being sensed (which has more than one turn) and thus an almost 100% duty cycle will immediately become 0%, the foregoing representing, for example, 359 degrees of rotation and then 0%. Also, when the sensing system malfunctions, the value 0 may be a typical failure mode.

OBJECT AND SUMMARY OF THE INVENTION

It is a general object of the present invention to provide a digitally programmable pulse-width-modulation (PWM) converter.

In accordance with the above object, there is provided a pulse-width-modulation converter where a sensor has a full scale output which is represented by a PWM input signal having a range of 0% to 100% duty cycles including a converter for converting the duty cycle range to a start duty cycle, P1, greater than 0% but less than a stop duty cycle, P2, less than or equal to 100%, P1 to P2 still representing said full scale output of the sensor, the converter comprises first and second clock means, the first clock means counting the pulse widths of the PWM input signal and sensing its pulse repetition rate, the second clock means having a predetermined and higher frequency than said first clock means, the ratio of said frequencies being proportional to P2–P1.

DETAILED DESCRIPTION OF PREFERRED EMBODIMENT

Figure 1:
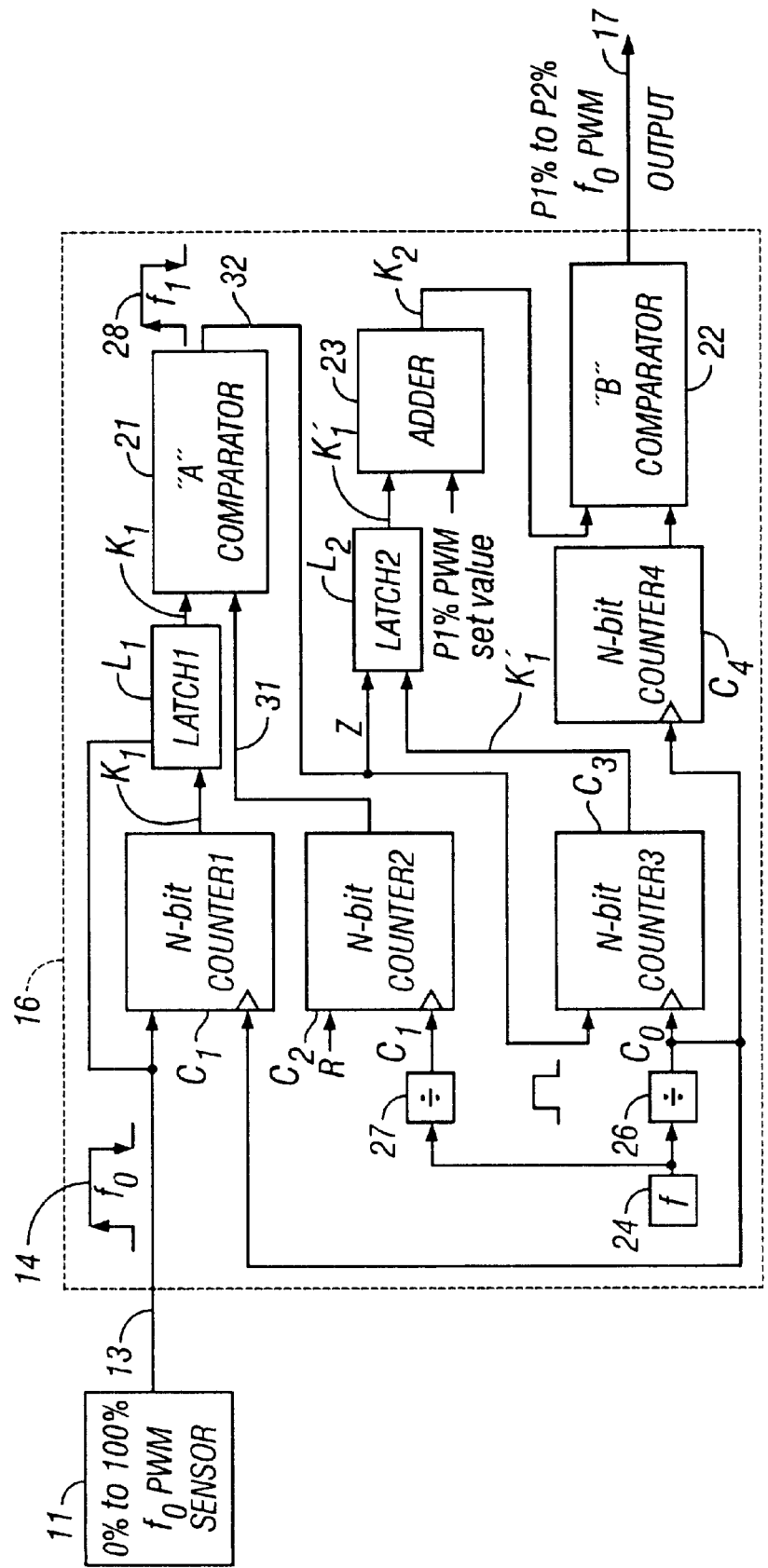
FIG. 1 is a block diagram of a converter.

FIG. 1 is a block diagram of the converter of the present invention where a sensor unit 11 (which may be the output of a rotational or position sensor of any type) is coupled to a pulse-width-modulation (PWM) converter which senses the analog signal and converts it to a 0% to 100% duty cycle signal which is on the output line 13. Such signal is represented as $f_0$ where $f_0$ is the pulse repetition rate of the input PWM signal. Such PWM signal represents the full scale output of sensor 11. The converter of FIG. 1 shown in the dashed block 16 converts the signal 14 to an output signal on line 17 having the same pulse repetition rate $f_0$ but with digitally preselected start and stop duty cycles indicated as P1 % to P2 %. Typically these might be 5% and 95%, respectively. Any other values of P1 and P2 can be selected from 0 to 100 with P2 greater than P1.

The major components of programmable PWM converter 16 consist of four counters, C1, C2, C3 and C4, latches, L1 and L2, which drive A and B comparators 21 and 22 and an adder unit 23. The counters are used to digitize the pulse widths (and also relate to the pulse repetition rate) of the PWM signal and the comparators are used to create the required PWM signal in digital form. In order to convert the incoming PWM signal 14 through the desired signal output 17 it is necessary to count the pulse widths of the incoming PWM signal with a faster rate. Such rate relates to both the pulse repetition frequency and the rate at which the individual pulse widths are counted. To provide the foregoing, a crystal oscillator 24 is provided designated, f, which by the divide units 26 and 27 provides the clock sources $C_0$ and $C_1$. With reference to the counters; clock source $C_0$ drives the counters C1, C3 and C4, and clock source $C_1$ drives the counter C2. The counters have full scale counts where counter C3 in this particular embodiment of the invention has $X_2$ counts and the remaining counters C1, C2 and C4 have $X_1$ counts.

Figure 2:
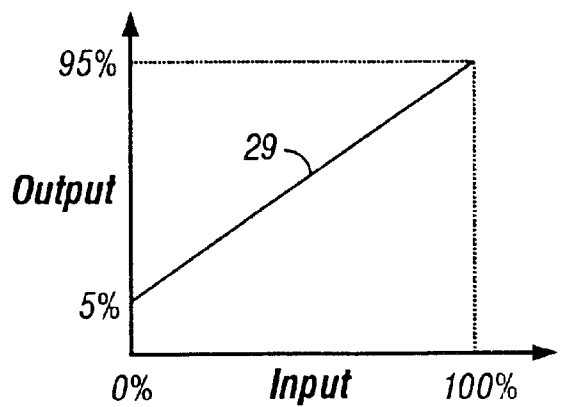
FIG. 2 is a characteristic curve.

In summary referring briefly to FIG. 2, the purpose of converter 16 is to convert an input characteristic 14 from the sensor unit 11 having 0% to 100% duty cycles to an output characteristic on line 17 having a start duty cycle of 5% and a stop duty cycle of 95%, the converted PWM signal still representing the full scale output of the sensor, which is indicated by the line 29.

Again referring back to FIG. 1 from an operational point of view, the various clock frequencies and full scale counts of the counters are related to and must be selected in accordance with the difference between the start and stop duty cycle percents. In the present example, this is 90% or a ratio 0.90.

In order to achieve the object of the present invention, the relationships shown in the following equation should be met.

$$P2 - P1 = \frac{f_0}{f_1} = \frac{X_2}{X_1} = \frac{C_0}{C_1}$$

Where, $f_0$, $f_1$: pulse repetition rate $C_0$, $C_1$: clock frequencies $X_1$, $X_2$: full scale count $X_1$—Counters 1, 2, and 4

$X_2$—Counter 3

For the ratio of the clock frequencies, the ratio must equal the difference in start and stop duty cycles, but their absolute values are chosen for the desired resolution of the system. And the same is true of the total counts of the counters.

Now referring to FIG. 1 and its operation, when an external or PWM signal frequency $f_0$, with a 0% to 100% duty cycle is fed to the converter 16 (that is, the signal 14) counter 1 is triggered and starts counting at the rising edge of the signal; it stops counting at the following edge of the signal 14. When the signal 14 goes low, it will latch the current value $K_1$ (which is the output of counter 1 through the latch and to the "A" comparator 21. At the same time signal 14 resets counter 1. The latch value $K_1$ is compared with the output value of counter 2 (see the line 31) by means of the comparator 21 and generates on the line 32 the PWM signal 28 having a pulse repetition rate $f_1$. This new and modified PWM signal is coupled on the line 32 both to counter 3 and latch L2.

The rising edge of $f_1$ triggers counter 3 to start counting and when this signal 28 goes low, it latches the current value, $K_1'$, via the latch L2 to the adder 23. Counter 3 is reset at the same time. This $K_1'$ value corresponding to the duty cycle of $f_1$ is added to a P1 % PWM set value and the resultant sum is $K_2$. The sum is compared to the output value of counter 4 by the "B" comparator 22. When the sum is greater than the current value of counter 4, the output of the B comparator will stay high; otherwise, it will be low until counter 4 overflows.

The value of counter 4 always contains additional counts corresponding to the P1 PWM set value so that it can maintain the minimum and maximum duty cycles, P1 and P2, for the output PWM signal. In other words, the output duty cycle is a proportional value between this sum of the current count of counter 3 and the P1 set value to the total number of counts of counter 4. In this manner, the converter will generate a PWM signal that has a same pulse repetition rate as the input PWM signal.

Figure 3:
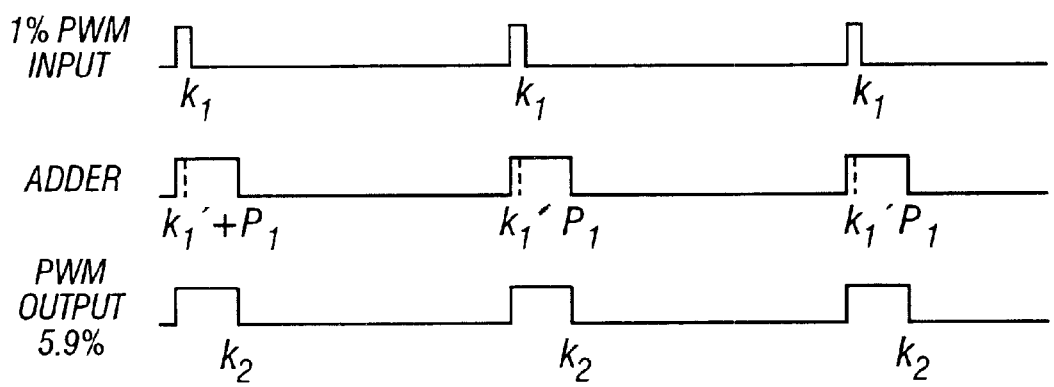
FIGS. 3 and 4 are timing diagrams for FIG. 1.
Figure 4:
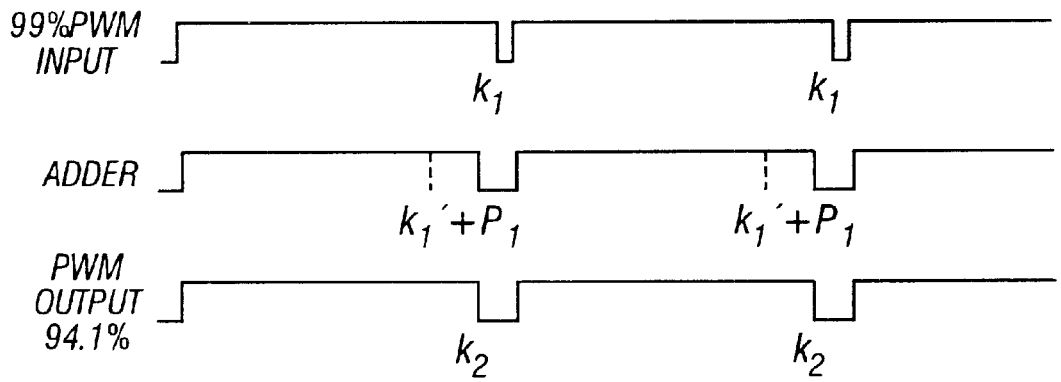

FIGS. 3 and 4 illustrate the foregoing with both a 1% PWM duty cycle input and a 99% PWM input. In accordance with the converter of the present invention, these are converted to the $K_1'$ plus P1 duty cycle output PWM signal shown in FIG. 3 and in FIG. 4. Any intermediate signals would also be modified. In both timing diagrams, the adder output is illustrated as being the sum of $K_1'$ plus P1 which is actually the $K_2$ value shown in the final PWM output in the timing diagram.

Specifically the relationship between the input (P in) and output (P out) PWM duty cycles is given by the following transfer function:

$$P \ out = \left(P1 + \frac{P \ in \ X_2}{X_1}\right) * 100\%$$

From the above equation it is obvious that as intermediate duty cycle values approach 50% any modification will decrease toward zero. Thus for $X_2/X_1$, equal to 0.90 a 1% Pin would be converted to 5.9%; 99% Pin to 94.1%.

In conjunction with the above equation it was mentioned that the different values were in many cases arbitrarily chosen. Thus, for the values illustrated in the above example, a 2 Khz 0% to 100% PWM signal was chosen as the input pulse repetition rate. In addition, the 5% start duty cycle and 95% stop duty cycle was chosen. In order to set up the system, first the user is required to select a clock source, $C_0$, as the reference for counters 1, 3 and 4; e.g. $C_0$=8.0 Mhz. If the crystal oscillator 24 (see FIG. 1) of 80 Mhz is chosen as a system clock, then a divide by ten divider 26 will provide a $C_0$ of 8.0 Mhz. With an 8.0 Mhz signal for the counter and a 2.0 Khz pulse repetition rate, the period of this signal is ½ Khz and therefore the total number of counts needed for counters 1, 2 and 4 is 4,000 and the total number of counts for counter 3 is the ratio 0.9, which is 3,600. This results in a pulse repetition frequency $f_1$ of 2.22 Khz which is the 0.9 ratio.

Since a counter with 4,000 counts is used to decode the 2.0 Khz PWM signal, then a second counter C2 with the same counting value (4000) must be used for decoding the 2.22 Khz PWM signal. But as illustrated in FIG. 1 counter 2 utilizes the clock frequency C1. This matches the 2.22 Khz PWM signal with the 2.0 Khz input PWM signal. All of the counters can be of the 12 bit type (4096) to achieve the required total number of counts of 3,600 as well as 4,000 with the two different clock frequencies $C_0$ and $C_1$.

In summary, a digitally programmable PWM converter has been provided.

What is claimed is:

1. In a pulse width modulation (PWM) system where a sensor has a full scale output, which is represented by a PWM input signal having a range of 0% to 100% duty cycles including a converter for converting said duty cycle range to a start duty cycle, P1, greater than 0% but less than a stop duty cycle, P2, less than or equal to 100%, P1 to P2 still representing said full scale output of said sensor, said converter comprising first and second clock means, said first clock means for counting the pulse widths of said PWM input signal and sensing its pulse repetition rate, said second clock means having a predetermined and higher frequency than said first clock means, the ratio of said frequencies being proportional to P2-P1.

2. A method of converting an input pulse width modulated (PWM) signal, which represents the full scale output of a sensor, such signal having a range of from 0% to 100% duty cycles, to an output PWM signal having a start duty cycle, P1, greater than 0% but less than a stop duty cycle, P2, less than or equal to 100%, P1 to P2 still representing the full scale output of said sensor comprising the following steps:

providing a first clock frequency for counting the pulse widths of said input PWM signal and its pulse repetition rate;

providing a second clock frequency higher than said first by a ratio proportional to P2-P1 and using such second clock frequency to modify said input PWM signal to provide a full scale output from P1 to P2.

3. In a system as in claim 1 including a plurality of counters driven by said clock means and comparators responsive to said counter outputs for creating a PWM signal in digital form, at least one counter having a full scale count less than the full scale count of said remaining counters and the ratio of said full scale counts being proportional to P2-P1.

4. In a system as in claim 3 including adder means for adding said P1 value to the output of said at least one counter.

5. In a system as in claim 3 where said full scale count of said remaining counters is related to said pulse repetition rate of said PWM input signal and said full scale count of said one counter is related to the pulse repetition rate of a PWM signal modified by said second clock frequency.

* * * * *

UNITED STATES PATENT AND TRADEMARK OFFICE
CERTIFICATE OF CORRECTION

| | | |
|---|---|---|
| PATENT NO. | : 6,545,621 B1 | Page 1 of 1 |
| APPLICATION NO. | : 10/006092 | |
| DATED | : April 8, 2003 | |
| INVENTOR(S) | : Asad M. Madni et al. | |

It is certified that error appears in the above-identified patent and that said Letters Patent is hereby corrected as shown below:

On Title Page, item [73] Assignee:
Replace "BEI Sensors & Systems Company, Inc,." with "BEI Sensors & Systems Company, Inc."

Signed and Sealed this
Fourth Day of November, 2014

Michelle K. Lee
*Deputy Director of the United States Patent and Trademark Office*